US011411560B1

(12) United States Patent
Yu et al.

(10) Patent No.: US 11,411,560 B1
(45) Date of Patent: Aug. 9, 2022

(54) ELECTRONIC SYSTEM, INTEGRATED CIRCUIT DIE AND OPERATION METHOD THEREOF

(71) Applicants: Global Unichip Corporation, Hsinchu (TW); Taiwan Semiconductor Manufacturing Company, Ltd., Hsinchu (TW)

(72) Inventors: Pei Yu, Hsinchu (TW); Yung-Sheng Fang, Hsinchu (TW); Chang-Ming Liu, Hsinchu (TW); Igor Elkanovich, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/389,374

(22) Filed: Jul. 30, 2021

(51) Int. Cl.
*H03K 19/0175* (2006.01)
*H03K 19/20* (2006.01)
*G06F 13/00* (2006.01)
*H04L 7/00* (2006.01)

(52) U.S. Cl.
CPC ........... *H03K 19/017509* (2013.01); *H03K 19/017545* (2013.01); *H03K 19/20* (2013.01); *G06F 13/00* (2013.01); *H04L 7/00* (2013.01)

(58) Field of Classification Search
None
See application file for complete search history.

(56) References Cited

U.S. PATENT DOCUMENTS

| 7,058,120 B1* | 6/2006 | Lu .......................... H03M 9/00 375/373 |
| 11,063,596 B1 | 7/2021 | Wang et al. |
| 2013/0311848 A1* | 11/2013 | Purohit ................ H04L 1/0057 714/752 |
| 2018/0095925 A1* | 4/2018 | Iyer ..................... G06F 13/4265 |

OTHER PUBLICATIONS

Ting-Hao Wang et al., "Interface of Integrated Circuit Die and Method for Arranging Interface Thereof", Unpublished U.S. Appl. No. 17/134,534, filed Dec. 28, 2020.
Ting-Hao Wang et al., "Circuit for Providing Clock to De-Serializer in Communication Physical Layer", Unpublished U.S. Appl. No. 17/147,405, filed Jan. 12, 2021.
Igor Elkanovich et al., "Circuit of Communication Interface Between Two Dies and Method to Manage Communication Interface", Unpublished U.S. Appl. No. 17/185,895, filed Feb. 25, 2021.

* cited by examiner

*Primary Examiner* — Jany Richardson
(74) *Attorney, Agent, or Firm* — JCIPRNET

(57) ABSTRACT

An electronic system, an integrated circuit die and an operation method thereof are provided. The integrated circuit die includes a plurality of interface circuit slices and a merging circuit. The transmission data stream sent from the transmitter die is split into a plurality of sub-data streams. Each of the interface circuit slices provides a physical layer to receive the corresponding one of the sub-data streams. The merging circuit is coupled to the interface circuit slices to receive the sub-data streams. The merging circuit merges the sub-data streams from the interface circuit slices back to the original data corresponding to the transmission data stream to be provided to an application layer. The merging circuit aligns the sub-data streams from the interface circuit slices in timing to mitigate different delays of the interface circuit slices.

35 Claims, 10 Drawing Sheets

FIG. 5

ELECTRONIC SYSTEM, INTEGRATED CIRCUIT DIE AND OPERATION METHOD THEREOF

BACKGROUND

Technical Field

The disclosure relates to an integrated circuit, particularly to an electronic system, an integrated circuit die and an operation method thereof.

Description of Related Art

Semiconductor-integrated-circuit-based digital electronic devices such as mobile phones, digital cameras, and personal digital assistants (PDA) are designed to have powerful functions to adapt to various applications developed in the modem, digital world. It is the trend of semiconductor manufacturing that digital electronic devices are becoming even smaller, slimmer, and lighter with improved functionality and higher performance. A semiconductor device may be packaged into a 2.5D semiconductor device, in which several dies are integrated into a larger integrated circuit. Contact elements, interposer layers, or redistribution layers (RDL) are adapted to connect different dies. Integrated fan-out (InFO) and chip-on-wafer-on-substrate (CoWoS) packaging technologies may be adapted to package multiple slices/dies that are incorporated side by side.

SUMMARY

The disclosure provides an electronic system, an integrated circuit die and an operation method thereof to reduce different delays of a plurality of first interface circuit slices.

In an embodiment of the present disclosure, the above-mentioned integrated circuit die includes a plurality of first interface circuit slices and a merging circuit. A first transmission data stream sent from a transmitter die is split into a plurality of first sub-data streams. Each of the first interface circuit slices provides a physical layer to receive the corresponding one of the first sub-data streams. The merging circuit is coupled to the first interface circuit slices to receive the first sub-data streams. The merging circuit merges the first sub-data streams from the first interface circuit slices back to the original data corresponding to the first transmission data stream to provide a first application layer. The merging circuit aligns the first sub-data streams from the first interface circuit slices in timing to mitigate different delays of the first interface circuit slices.

In an embodiment of the present disclosure, the above-mentioned operation method includes: each of a plurality of first interface circuit slices of the integrated circuit die provides a physical layer to receive the corresponding one of a plurality of first sub-data streams, wherein the first transmission data stream sent from a transmitter die is split into the first sub-data streams; a merging circuit of the integrated circuit die aligns the first sub-data streams from the first interface circuit slices in timing to mitigate different delays of the first interface circuit slices; and the merging circuit merges the first sub-data streams from the first interface circuit slices back to the original data corresponding to the first transmission data stream to be provided to a first application layer.

In an embodiment of the present disclosure, the above-mentioned electronic system includes a transmitter die and an integrated circuit die. The transmitter die splits a first transmission data stream into a plurality of first sub-data streams. The integrated circuit die includes a plurality of first interface circuit slices and a merging circuit. Each of the first interface circuit slices provides a physical layer to receive the corresponding one of the first sub-data streams. The merging circuit is coupled to the first interface circuit slices to receive the first sub-data streams. The merging circuit merges the first sub-data streams from the first interface circuit slices back to the original data corresponding to the first transmission data stream to provide a first application layer. The merging circuit aligns the first sub-data streams from the first interface circuit slices in timing to mitigate different delays of the first interface circuit slices.

Based on the above, the transmitter die of the embodiments of the present disclosure may split the first transmission data stream (the original data) into multiple first sub-data streams, then the interface circuit slices of the transmitter die may send these first sub-data streams to the first interface circuit slices of the integrated circuit die. The merging circuit may selectively merge the first sub-data streams from the first interface circuit slices back to the original data, and provide the original data to the first application layer. In an actual operating situation, the sub-data streams output by different interface slices may have different delays, and the merging circuit may align these first sub-data streams from the first interface circuit slices in timing, so that the integrated circuit die may mitigate different delays of the first interface circuit slices.

In order to make the above-mentioned features and advantages of the present disclosure more comprehensible, the following specific embodiments are described in detail in conjunction with the accompanying drawings.

BRIEF DESCRIPTION OF THE DRAWINGS

FIG. 5 is a schematic diagram of the structure of a contact element pattern according to an embodiment of the present disclosure.

DESCRIPTION OF THE EMBODIMENTS

Figure 1:
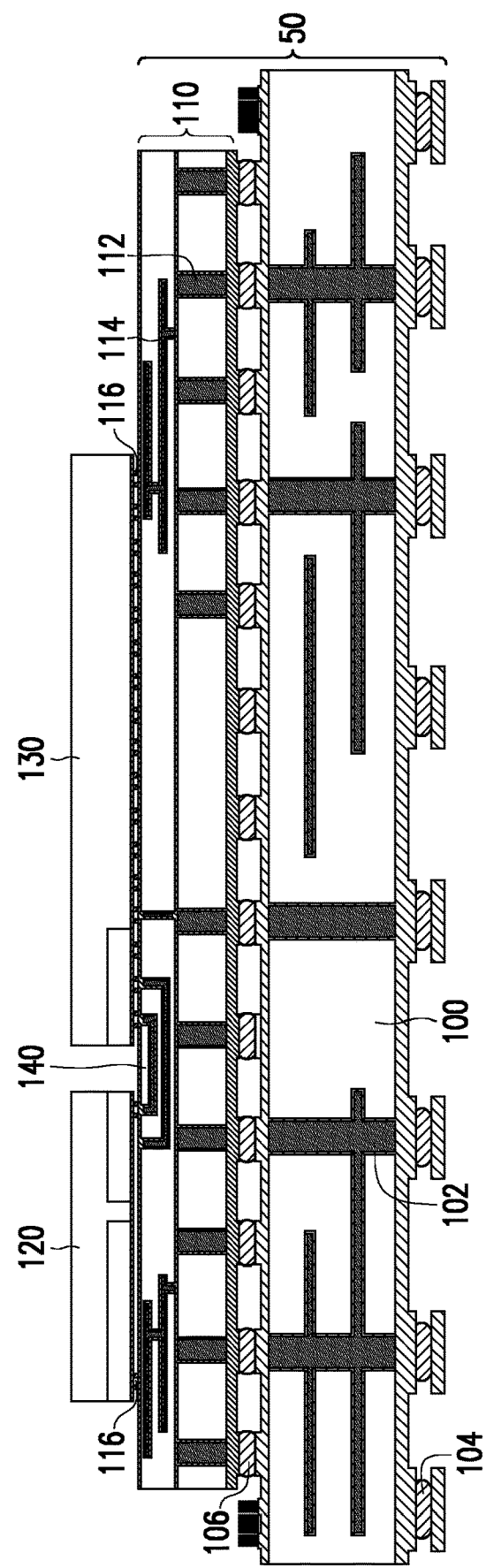
FIG. 1 is a schematic diagram of a cross-sectional stacked structure of a 2.5D semiconductor device with a communication interface according to an embodiment of the present disclosure.

The term "coupling" (or "connection") used in the full text of this case (including the claims of the patent application) can refer to any direct or indirect connection. For example, if it is described in the text that the first device is coupled (or connected) to the second device, it should be interpreted as that the first device may be directly connected to the second device, or the first device may be indirectly connected to the second device through other devices or some kind of connection. The terms "first" and "second" mentioned in the full text of the specification of this case (including the claims of the patent application) are used to name the element, or to distinguish different embodiments or scopes, but it is not used to limit the upper or lower limit of the number of components, nor is it used to limit the order of the components. In addition, wherever possible, elements/components/steps with the same reference numbers in the drawings and embodiments represent the same or similar parts. Related descriptions may be referred to when elements/components/steps use the same reference numerals or use the same terms in different embodiments.

The disclosure relates to data transmission between two devices (for example, two dies). Several embodiments are provided below to describe the present disclosure, but the present disclosure is not limited to the embodiments.

The entire integrated circuit may be manufactured into a semiconductor device through a semiconductor manufacturing process, and the semiconductor device may be manufactured based on a stack structure of 2.5D semiconductor devices. The interface of the die (the receiving device) for receiving data may include a frame decoding circuit associated with a de-serialized circuit. In one embodiment, the interface in the semiconductor structure is integrated in the entire integrated circuit.

First, semiconductor manufacturing is described herein. FIG. 1 is a schematic diagram of a cross-sectional stacked structure of a 2.5D semiconductor device with a communication interface according to an embodiment of the present disclosure. In FIG. 1, based on 2.5D packaging technology, a chip-on-wafer-on-substrate (CoWoS) or integrated fan-out (InFO) platform 50 with an expected integrated circuit structure is formed. The CoWoS or InFO platform 50 may include a package substrate 100 having bottom solder balls 104 and top contactor elements 106. A via 102 may be adapted to connect the bottom solder ball 104 to the top contactor element 106. In addition, an interposer or redistribution layer (RDL) 110 may be further formed on the substrate 100, which is connected to the contact element 106. The interposer or redistribution layer 110 is embedded with a routing structure 140, wherein the routing structure 140 has a routing path for connection purposes. The interposer or redistribution layer 110 may also include a through-silicon-via (TSV) 112, a interconnect wiring 114, and a contact element 116. Here, depending on the adopted manufacturing process, the contact element 116 may be a through hole, a contact element, or any suitable connection structure for terminal-to-terminal contact. This embodiment does not limit the contact elements 106 and 116 to any specific type.

In practical applications, additional dies may also be adopted, such as application-specific integrated circuit (ASIC) die 130 and serializer-deserializer (SerDes) die 120, to implement the CoWoS or InFO platform 50. The ASIC die 130 and the SerDes die 120 are connected by the routing structure 140 (the wiring 114 and the contact element 116). One ASIC die 130 may be connected to multiple SerDes dies 120 for various peripheral communications.

Figure 2:
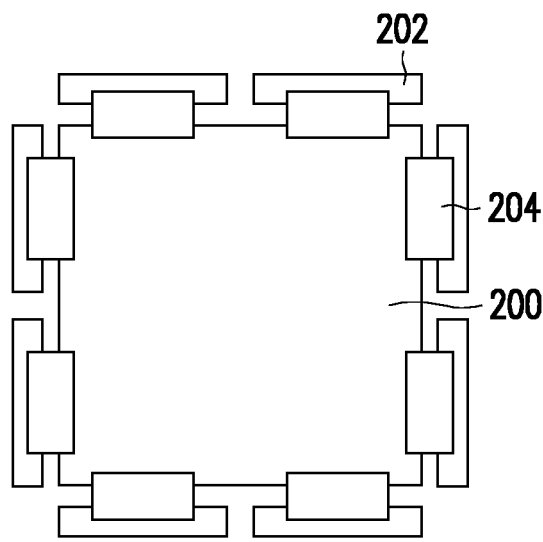
FIG. 2 is a schematic top view of a die connected to other dies through a communication interface according to an embodiment of the present disclosure.

FIG. 2 is a schematic top view of a die connected to other dies through a communication interface according to an embodiment of the present disclosure. In FIG. 2, a die 200 (for example, a processor or an ASIC die) may be connected to a plurality of dies 202 through a communication interface 204, so that data may be sent between the die 200 and the die 202. The communication interface 204 may include wiring and contact elements in the contact element pattern so that the die 200 may be connected to the die 202.

Figure 3:
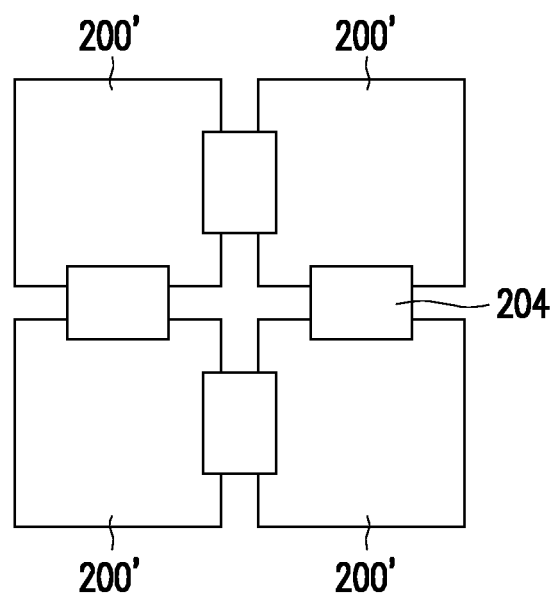
FIG. 3 is a schematic top view of a plurality of dies connected to each other through a communication interface according to another embodiment of the present disclosure.

FIG. 3 is a schematic top view of a plurality of dies connected to each other through a communication interface according to another embodiment of the present disclosure. In FIG. 3, a plurality of processor dies 200' may be connected together to form a large-scale processor with more powerful functions. In this case, these processor dies 200' are also connected through the communication interface 204.

As described above, the 2.5D packaging process may be applied to stack various dies side by side without substantially further consuming the device area. However, in order for the dies to be connected more freely, the contact elements in the communication interface 204 need to be appropriately arranged in a compact manner and be further symmetrized for receiving and sending signals. The communication between the two dies, the die 200 and the die 202, may be easily placed in the peripheral area. Here, the communication interface 204 may also refer to a Glink interface provided in the market.

Figure 4:
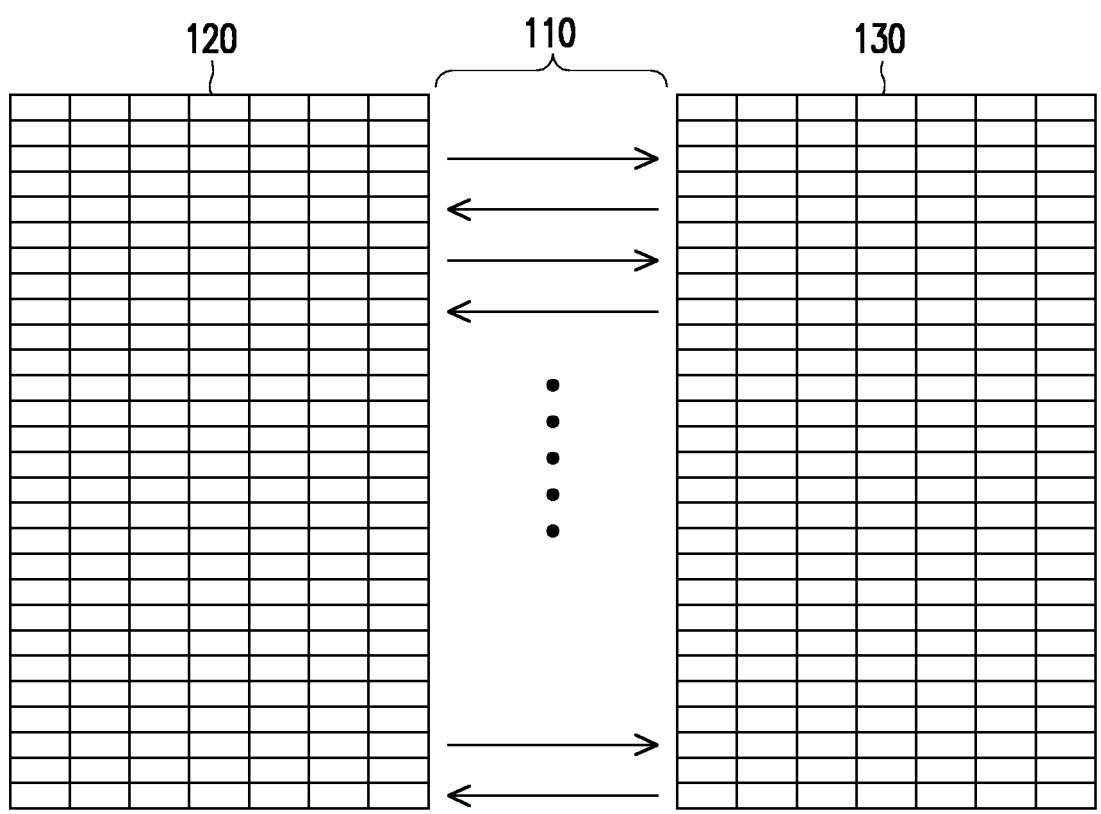
FIG. 4 is a schematic diagram of communication between two dies based on an interface of an interposer layer or a redistribution layer according to an embodiment of the present disclosure.

FIG. 4 is a schematic diagram of communication between two dies based on an interface of an interposer layer or a redistribution layer according to an embodiment of the present disclosure. In FIG. 4, in an embodiment, an ASIC die 130 and a SerDes die 120 communicate through an interposer or redistribution layer 110. The contact elements for the ASIC die 130 and the SerDes die 120 that are in contact with the interposer or redistribution layer 110 are appropriately arranged. Each contact element may send a specific signal at the same time. Therefore, the parallel bus is established based on the contact elements. The signal at each contact element is in a serial format, such as a bit string.

Figure 5:
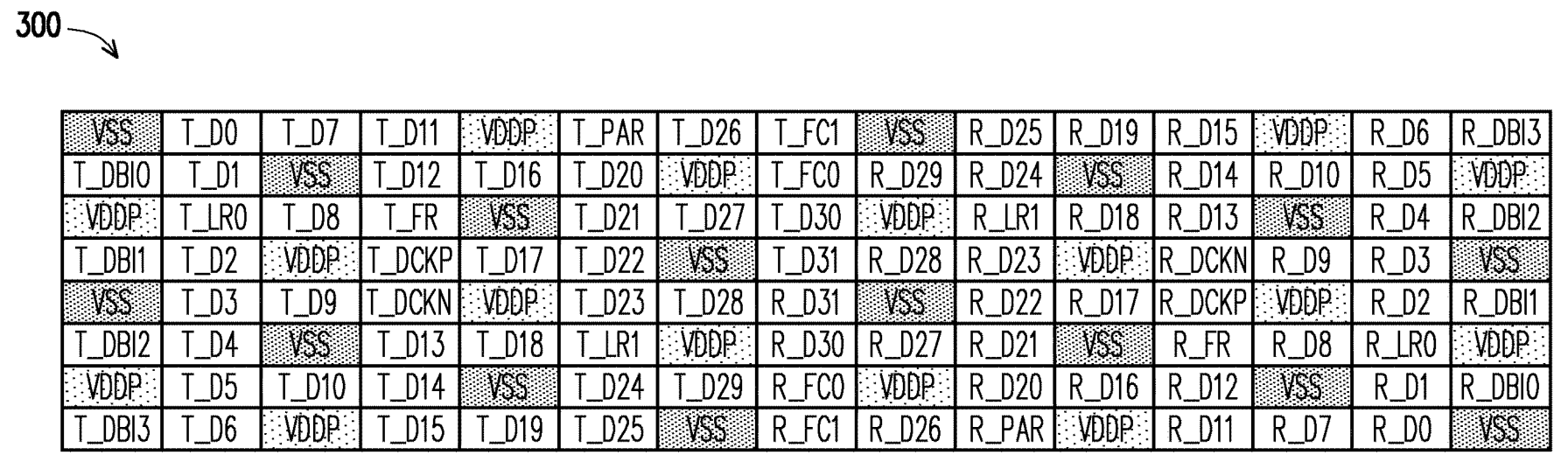

FIG. 5 is a schematic diagram of the structure of a contact element pattern according to an embodiment of the present disclosure. In FIG. 5, the total number of the contact elements involved in the communication interface may be a number, and the signals are sent in parallel in the communication interface. The total number of the contact elements involved in the communication interface may be a larger number. The signal is sent in parallel between the dies. According to the size of the data in a bus, the size of the 32-bit data with the operating voltage and other function signals is set as a slice (please refer to the contact element pattern 300). The contact element pattern 300 may a copy in a certain number (for example, 8) to adapt to the total data size in the parallel communication. In an embodiment, the data corresponds to 32 bits having a sequence of R_D0 to R_D31 and T_D0 to T_D31. In the sequence, T represents a contact element for transmission, and R represents a contact element for reception. In addition, the contact element pattern 300 also includes a plurality of low voltage signals VSS and a plurality of high voltage signals VDDP. And it also contains various functional signals, including FRAM T/R_FR, clock T/R_DCK_P/N, flow control T/R_FC[1:0], DBI T/R_DBI [3:0], parity T/R_PAR, and lane repair T/R_LR[1:0]. However, the contact element adapted for the functional signal is not limited to the described embodiments.

Table 1 is an embodiment of the contact elements defining a transmission (T) group or a reception (R) group. The transmitting group and the reception group have the same number of contact elements.

TABLE 1

| Types of contact element | Number | Definition |
| --- | --- | --- |
| Data, T/R [31:0] | 32 | data bits are synchronized with CLK |
| Frame, T/R_FRAME | 1 | FRAME bit is synchronized with CLK |
| Clock, T/R_DCK_P/N | 2 | CLK differential pair |
| Flow control, T/R_FC [1:0] | 2 | asynchronous to the data bus and in different directions |
| DBI, T/R_DBI[3:0] | 4 | One DBI per bit, adapted to reverse the bus content for better single sign-on (SSO) |
| Parity, T/R_PAR | 1 | One every 32 bits, adapted to identify error conditions |
| Lane repair, T/R_LR[1:0] | 2 | lane repair bits, adapted to repair data, parity, and DBI, and not adapted to repair CLK, FRAME, and FC signals |

Based on the interposer or redistribution layer 110 described above, various signals are communicated between the two dies. However, in one example, a group of parallel signals in communication may be converted into a serial format to be sent/received through a wiring of a contact element. Once the data signal in serial format is received by the die, the die de-serializes the data signal into a parallel format.

Figure 6:
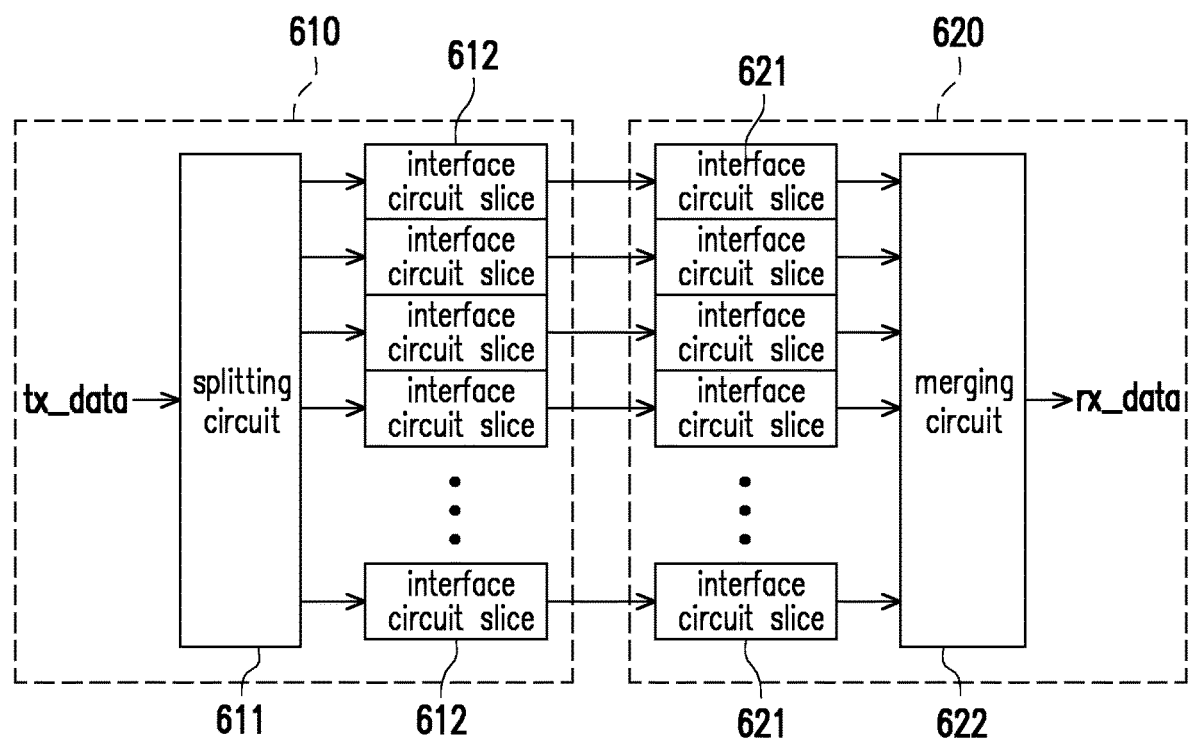
FIG. 6 is a schematic diagram of a circuit block of an electronic system according to an embodiment of the present disclosure.

FIG. 6 is a schematic diagram of a circuit block of an electronic system according to an embodiment of the present disclosure. The electronic system shown in FIG. 6 includes a transmitter die 610 and an integrated circuit die 620 (for example, a receiver die). The transmitter die 610 may send a plurality of sub-data streams to the integrated circuit die 620 through a communication interface (the routing structure). According to the actual design, the related description of the SerDes die 120 and/or the ASIC die 130 may be used as one of many embodiment examples of the transmitter die 610 and/or the integrated circuit die 620. Or, the description of the transmitter die 610 and/or the integrated circuit die 620 may be analogized with reference to the related description of the die 200, the die 202, and/or the processor die 200'.

Figure 7:
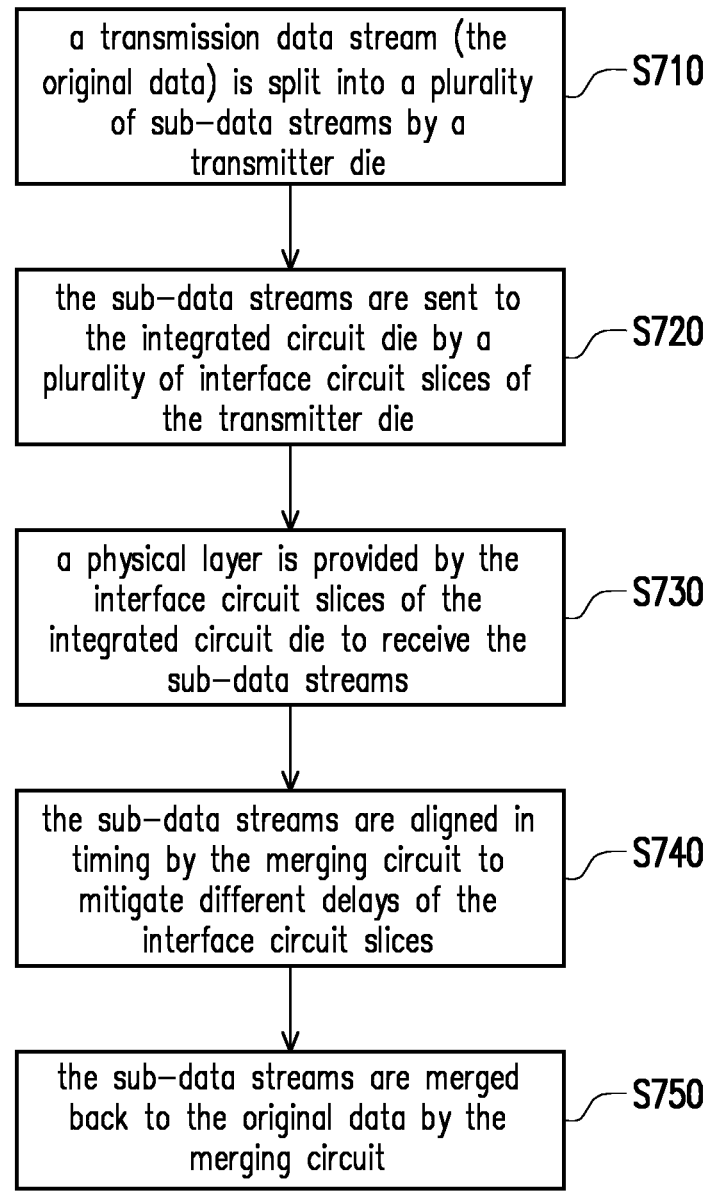
FIG. 7 is a schematic flowchart of an operation method of an integrated circuit die according to an embodiment of the present disclosure.

FIG. 7 is a schematic flowchart of an operation method of an integrated circuit die 620 according to an embodiment of the present disclosure. In FIG. 6 and FIG. 7, the transmitter die 610 may include a splitting circuit 611 and a plurality of interface circuit slices 612. In step S710, the splitting circuit 611 of the transmitter die 610 splits a transmission data stream tx_data (the original data) into a plurality of sub-data streams for the interface circuit slices 612 of the transmitter die 610. According to actual applications, the transmission data stream tx_data may include user data (data of the application layer) or other data.

The interface circuit slices 612 are coupled to the splitting circuit 611 to receive the sub-data streams. The number of the interface circuit slices 612 of the transmitter die 610 may be determined based on actual design requirements. Each of the interface circuit slices 612 may provide a physical layer. In step S720, the interface circuit slices 612 of the transmitter die 610 send the sub-data streams to the integrated circuit die 620.

The integrated circuit die 620 includes a plurality of interface circuit slices 621 and a merging circuit 622. In step S730, each of the interface circuit slices 621 of the integrated circuit die 620 may provide a physical layer to receive the corresponding one of the sub-data streams from the transmitter die 610. In some embodiments, the data width of any one of the sub-data streams is the same as the bus width of a physical layer parallel bus of any one of the interface circuit slices 612 (or 621) based on design requirements.

The merging circuit 622 is coupled to the interface circuit slices 621 to receive the sub-data streams. In step S740, the merging circuit 622 may align the sub-data streams from the interface circuit slices 621 in timing to mitigate different delays of the interface circuit slices 621. In step S750, the merging circuit 622 may merge the sub-data streams from the interface circuit slices 621 back to a transmission data stream rx_data (the original data corresponding to the transmission data stream tx_data). In some application examples, the transmission data stream rx_data may be provided to the application layer. In some embodiments, the merging circuit 622 may merge the sub-data streams from the interface circuit slices 621 back to the transmission data stream rx_data (the original data) according to the order of data arrival.

According to the actual design, in some embodiments, the identification (ID) number corresponding to the transmission data stream tx_data is attached to each of the data words of the transmission data stream tx_data. The ID number of these data words of the transmission data stream tx_data may be generated by a counter (not shown) of the transmitter die 610, where the counting period of the counter is equal to or greater than the maximum latency difference between different interface circuit slices (the physical layer interfaces). Therefore, the merging circuit 622 may match the ID number of the data words received from the interface circuit slices 621 to merge the sub-data streams output by the interface circuit slices 621 back to the transmission data stream rx_data (the original data corresponding to the transmission data stream tx_data). When any data word of the sub-data streams from the interface circuit slices 621 is damaged, the merging circuit 622 may find the first undamaged data word in the sub-data streams from the interface circuit slices 621 by using the ID number, and align the sub-data streams from the interface circuit slices 621 by using the ID number.

In other embodiments, according to their actual designs, an alignment marker is attached to each of these sub-data streams of the transmission data stream tx_data. The merging circuit 622 may merge the sub-data streams output by the interface circuit slices 621 back to the transmission data stream rx_data (the original data corresponding to the transmission data stream tx_data) according to the alignment mark. For example, each of these interface circuit slices 621 may further receive frame information from the transmitter die 610, and the alignment mark may be a designated code in a data valid indication field of the frame information. The designated code may be defined/decided based on the actual designs. When any data word of these sub-data streams from these interface circuit slices 621 is damaged, the merging circuit 622 may find the first undamaged data word in the sub-data streams from the interface circuit slices 621 by using the alignment mark, and align the sub-data streams output by the interface circuit slices 621 by using the alignment mark.

Figure 8:
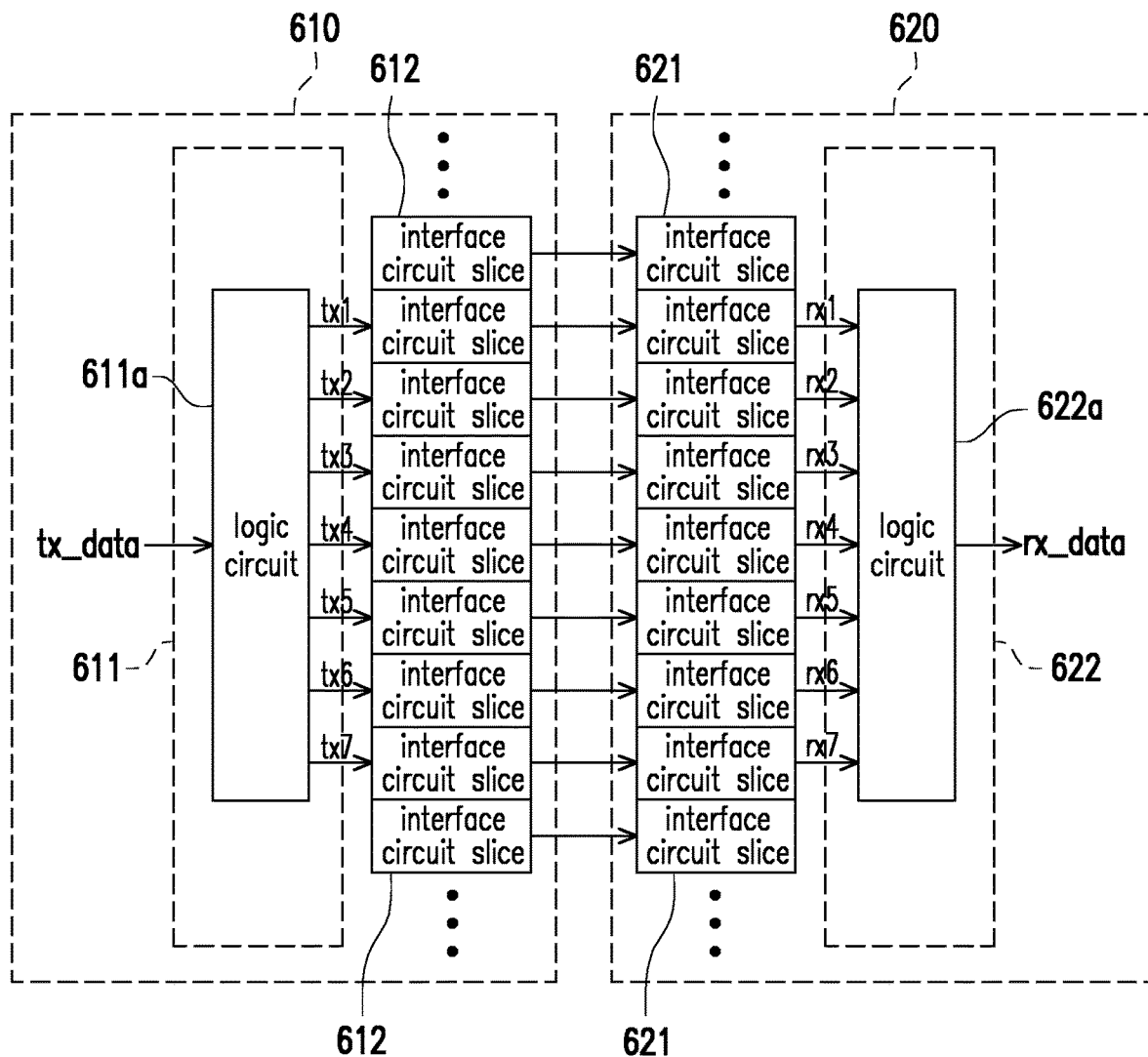
FIG. 8 is a schematic diagram of an operation scenario of the splitting circuit and the merging circuit shown in FIG. 6 according to an embodiment of the present disclosure.

FIG. 8 is a schematic diagram of an operation scenario of the splitting circuit 611 and the merging circuit 622 shown in FIG. 6 according to an embodiment of the present disclosure. Please refer to FIG. 6 and FIG. 8. The splitting circuit 611 has a logic circuit for splitting one or more transmission data streams and distributing them to the interface circuit slices 612. Take the application scenario shown in FIG. 8 as an example. According to the bus width of the physical layer parallel bus of any one of the interface circuit slices 612, an equivalent logic circuit 611a in the splitting circuit 611 splits the transmission data stream tx_data (the original data) into a plurality of sub-data streams (such as sub-data streams tx1, tx2, tx3, tx4, tx5, tx6, and tx7 shown in FIG. 8) for the interface circuit slices 612. Assuming that the bus width of the physical layer parallel bus of any one of the interface circuit slices 612 is M bits (M is an integer), the data width of the sub-data streams tx2 to tx6 is also M bits. Assuming that the data width of the transmission data stream tx_data is N bits (N is an integer), the data width of the sub-stream tx1 is K bits (K is an integer less than or equal to M), and the data width of the sub-data stream tx7 is L bits (L is an integer less than or equal to M), then N=K+5*M+L.

The merging circuit 622 has a logic circuit for selecting one or more of the interface circuit slices 621 and for merging the sub-data streams output by the selected interface circuit slices. Take the application scenario shown in FIG. 8 as an example. An equivalent logic circuit 622a in the merging circuit 622 receives sub-data streams rx1, rx2, rx3, rx4, rx5, rx6, and rx7 from the interface circuit slices 621, and the sub-data streams rx1 to rx7 are merged to generate the transmission data stream rx_data (the original data corresponding to the transmission data stream tx_data). In the embodiment shown in FIG. 8, the data width of the sub-data stream rx1 is K bits, the data width of the sub-data streams rx2 to rx6 is M bits, and the data width of the sub-data stream rx7 is L bits.

Figure 9:
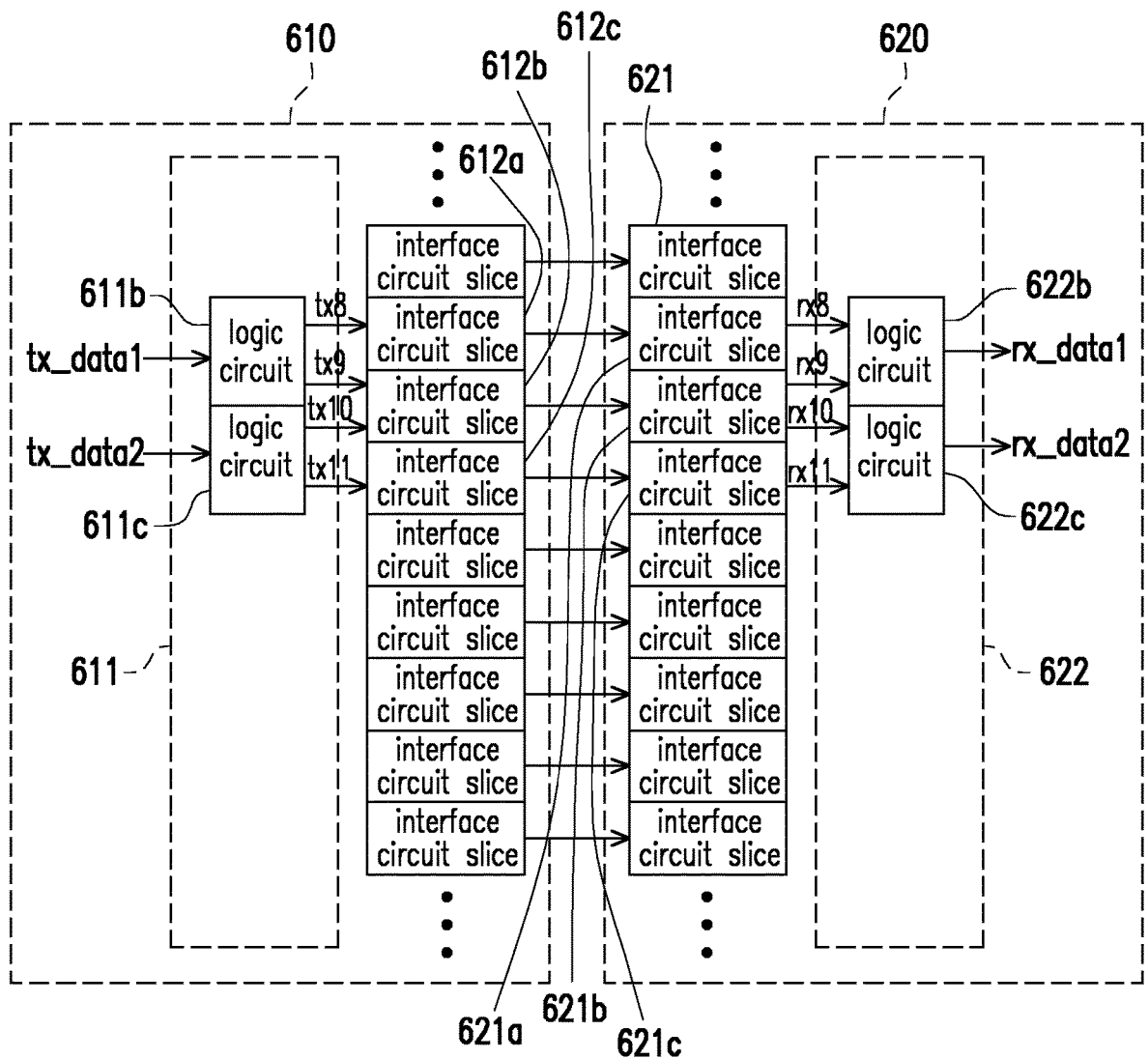
FIG. 9 is a schematic diagram of an operation scenario of the splitting circuit and the merging circuit shown in FIG. 6 according to another embodiment of the present disclosure.

FIG. 9 is a schematic diagram of an operation scenario of the splitting circuit 611 and the merging circuit 622 shown in FIG. 6 according to another embodiment of the present disclosure. Please refer to FIG. 6 and FIG. 9. The logic circuit of the splitting circuit 611 splits one or more transmission data streams and distributes them to the interface circuit slices 612. Take the application scenario shown in FIG. 9 as an example. According to the bus width of the physical layer parallel bus of any one of the interface circuit slices 612, an equivalent logic circuit 611b in the splitting circuit 611 may split a transmission data stream tx_data1 (a first original data) into sub-data streams tx8 and tx9 for interface circuit slices 612a and 612b, an equivalent logic circuit 611c in the splitting circuit 611 may split a transmission data stream tx_data2 (a second original data) into sub-data streams tx10 and tx11 for interface circuit slices 612b and 612c.

Assuming that the bus width of the physical layer parallel bus of any one of the interface circuit slices 612 is M bits (M is an integer), the data width of the sub-data stream tx8 may be M bits. Assuming that the data width of the transmission data stream tx_data1 is N bits (N is an integer), and the data width of the sub-data stream tx9 is L bits (L is an integer less than or equal to M), then N=M+L. Assuming that the data width of the transmission data stream tx_data2 is K bits (K is an integer), then the data width of the sub-data stream tx10 is P bits (P=M−L), and the data width of the sub-stream tx11 is R bits (R=K−P, and R is an integer less than or equal to M). In the embodiment shown in FIG. 9, the sub-data stream tx9 (a first sub-stream) and the sub-data stream tx10 (a second sub-stream) are sent to the same interface circuit slice 621b of the interface circuit slices 621 of the integrated circuit die 620 through the same interface circuit slice 612b of the transmitter die 610, and the same interface circuit slice 621b can split the data stream provided by the same interface circuit slice 612b back to sub-data stream tx9 (the first sub-stream, i.e. sub-data stream rx9) and the sub-data stream tx10 (the second sub-stream, i.e. sub-data stream rx10) to the merging circuit 622. The sum of the data width of the sub-data stream tx9 (the first sub-stream) and the data width of the sub-data stream tx10 (the second sub-stream) is the same as the bus width (M bits) of the physical layer parallel bus of any interface circuit slice 621.

The merging circuit 622 has a logic circuit for selecting one or more of the interface circuit slices 621 and for merging the sub-data streams output by the selected interface circuit slices. Take the application scenario shown in FIG. 9 as an example. An equivalent logic circuit 622b in the merging circuit 622 may receive the sub-data streams rx8 and rx9 from these interface circuit slices 621, and merge the sub-data streams rx8 and rx9 to generate a transmission data stream rx_data1 (the first original data corresponding to the transmission data stream tx_data1). In the embodiment shown in FIG. 9, the data width of the sub-data stream rx8 is M bits, the data width of the sub-data stream rx9 is L bits, and the data width of the transmission data stream rx_data1 is N bits. An equivalent logic circuit 622c in the merging circuit 622 may receive the sub-data streams rx10 and rx11 from these interface circuit slices 621, and the sub-data streams rx10 to rx11 are merged to generate a transmission data stream rx_data2 (the second original data corresponding to the transmission data stream tx_data2). The data width of the sub-data stream rx10 is P bits, the data width of the sub-data stream rx11 is R bits, and the data width of the transmission data stream rx_data2 is K bits.

Figure 10:
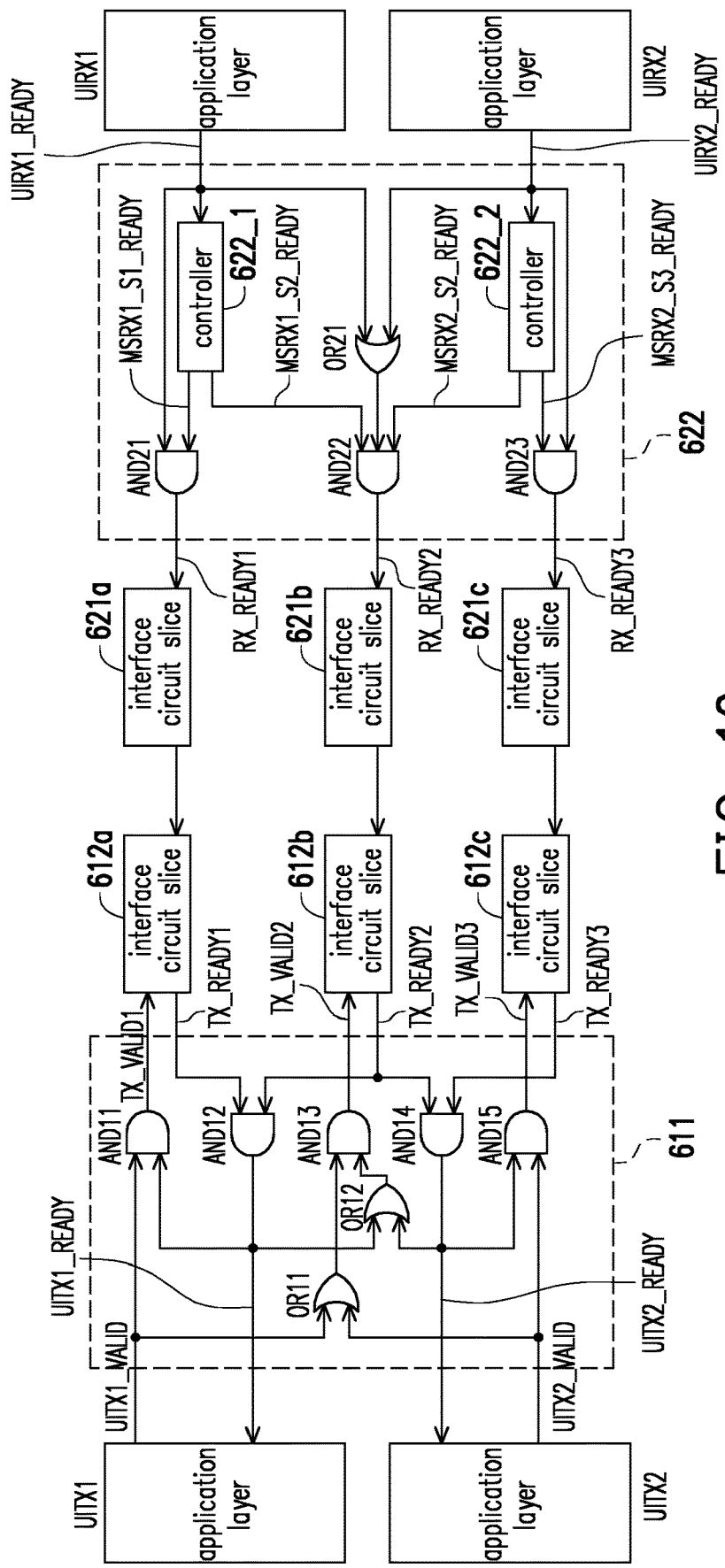
FIG. 10 is a circuit block diagram of the splitting circuit and the merging circuit shown in FIG. 9 according to an embodiment of the present disclosure.

In addition to the transmission of the sub-data streams, the interface circuit slices 612 of the transmitter die 610 and the interface circuit slices 621 of the integrated circuit die 620 also send validity signals and ready signals. For example, FIG. 10 is a circuit block diagram of the splitting circuit 611 and the merging circuit 622 shown in FIG. 9 according to an embodiment of the present disclosure. Please refer to FIG. 9 and FIG. 10. The transmission data stream tx_data1 shown in FIG. 9 may be provided by the application layer UITX1 shown in FIG. 10, and the transmission data stream tx_data2 shown in FIG. 9 may be provided by the application layer UITX2 shown in FIG. 10. For the sake of simplicity, FIG. 10 does not show the data streams and the sub-data streams.

The application layer UITX1 outputs a validity signal UITX1_VALID to the splitting circuit 611. The validity signal UITX1_VALID indicates the validity of the transmission data stream tx_data1. The application layer UITX2 outputs a validity signal UITX2_VALID to the splitting circuit 611. The validity signal UITX2_VALID indicates the validity of the transmission data stream tx_data2.

In the embodiment shown in FIG. 10, the splitting circuit 611 includes an OR gate OR11, an OR gate OR12, an AND gate AND11, an AND gate AND12, an AND gate AND13, an AND gate AND14, and an AND gate AND15. The first input terminal of the AND gate AND11 and the first input terminal of the OR gate OR11 are coupled to the application layer UITX1 to receive the validity signal UITX1_VALID. The first input terminal of the AND gate AND15 and the second input terminal of the OR gate OR11 are coupled to the application layer UITX2 to receive the validity signal UITX2_VALID. The output terminal of the AND gate AND11 outputs the validity signal TX_VALID1 to the interface circuit slice 612a. And according to the validity signal TX_VALID1, the interface circuit slice 612a determines whether to send the sub-data stream tx8 shown in FIG. 9 to the interface circuit slice 621a of the integrated circuit die 620.

Based on the ready signal provided by the interface circuit slice 621a, the interface circuit slice 612a outputs a ready signal TX_READY1. Based on the ready signal provided by the interface circuit slice 621b of the integrated circuit die 620, the interface circuit slice 612b outputs a ready signal TX_READY2. The first input terminal of the AND gate AND12 is coupled to the interface circuit slice 612a to receive the ready signal TX_READY1. The second input terminal of the AND gate AND12 is coupled to the interface circuit slice 612b to receive the ready signal TX_READY2. The output terminal of the AND gate AND12 is coupled to the application layer UITX1 to provide a ready signal UITX1_READY. The second input terminal of the AND gate AND11 is coupled to the output terminal of the AND gate AND12 to receive the ready signal UITX1_READY.

Based on the ready signal provided by the interface circuit slice 621c, the interface circuit slice 612c outputs a ready signal TX_READY3. The first input terminal of the AND gate AND14 is coupled to the interface circuit slice 621b to receive the ready signal TX_READY2. The second input terminal of the AND gate AND14 is coupled to the interface circuit slice 621c to receive the ready signal TX_READY3. The output terminal of the AND gate AND14 is coupled to the application layer UITX2 to provide a ready signal UITX2_READY. The first input terminal of the OR gate OR12 is coupled to the output terminal of the AND gate AND12 to receive the ready signal UITX1_READY. The second input terminal of the OR gate OR12 is coupled to the output terminal of the AND gate AND14 to receive the ready signal UITX2_READY. The first input terminal of the AND gate AND13 is coupled to the output terminal of the OR gate OR11. The second input terminal of the AND gate AND13 is coupled to the output terminal of the OR gate OR12. The output terminal of the AND gate AND13 outputs a validity signal TX_VALID2 to the interface circuit slice 612b. According to the validity signal TX_VALID2, the interface circuit slice 612b determines whether to send the sub-data streams tx9 and tx10 shown in FIG. 9 to the interface circuit slice 621b of the integrated circuit die 620.

The second input terminal of the AND gate AND15 is coupled to the output terminal of the AND gate AND14 to receive the ready signal UITX2_READY. The output terminal of the AND gate AND15 outputs a validity signal TX_VALID3 to the interface circuit slice 612c. And according to the validity signal TX_VALID3, the interface circuit slice 612c determines whether to send the sub-data stream tx11 shown in FIG. 9 to the interface circuit slice 621c of the integrated circuit die 620. Based on the ready signal provided by the interface circuit slice 621c, the interface circuit slice 612c outputs the ready signal TX_READY3. The second input terminal of the AND gate AND14 is coupled to the interface circuit slice 621c to receive the ready signal TX_READY3.

An application layer UIRX1 outputs and receives a first reception ready signal UIRX1_READY to the merging circuit 622. The first reception ready signal UIRX1_READY indicates whether the application layer UIRX1 is ready to receive data. An application layer UIRX2 outputs and receives a second reception ready signal UIRX2_READY to the merging circuit 622. The second reception ready signal UIRX2_READY indicates whether the application layer UIRX2 is ready to receive data.

In the embodiment shown in FIG. 10, the merging circuit 622 includes an AND gate AND21, an AND gate AND22, an AND gate AND23, an OR gate OR21, a controller 622_1, and a controller 622_2. The controller 622_1 is coupled to the application layer UIRX1 to receive the first reception ready signal UIRX1_READY. The controller 622_2 is coupled to the application layer UIRX2 to receive the second reception ready signal UIRX2_READY. Based on the reception ready signals UIRX1_READY and UIRX2_READY, the controllers 622_1 and 6222 may manage the interface circuit slices 621 (for example, the interface circuit slices 621a, 621b, and 621c shown in FIG. 10) to generate multiple ready signals. For example, the controller 6221 generates ready signals MSRX1_S1_READY and MSRX1_S2_READY shown in FIG. 10, and the controller 622_2 generates ready signals MSRX2_S2_READY and MSRX2_S3_READY shown in FIG. 10. The ready signal MSRX1_S1_READY indicates whether the interface circuit slice 621a is ready. The ready signals MSRX1_S2_READY and MSRX2_S2_READY indicate whether the interface circuit slice 621b is ready. The ready signal MSRX2_S3_READY indicates whether the interface circuit slice 621c is ready.

The first input terminal of the AND gate AND21 is coupled to the controller 622_1 to receive the ready signal MSRX1_S1_READY. The second input terminal of the AND gate AND21 receives the first reception ready signal UIRX1_READY from the application layer UIRX1. The output terminal of the AND gate AND21 is coupled to the interface circuit slice 621a to provide a ready signal RX_READY1. The first input terminal of the OR gate OR21 is coupled to the application layer UIRX1 to receive the first reception ready signal UIRX1_READY. The second input terminal of the OR gate OR21 receives the second reception ready signal UIRX2_READY from the application layer UIRX2. The first input terminal of the AND gate AND22 is coupled to the controller 622_1 to receive the ready signal MSRX1_S2_READY. The second input terminal of the AND gate AND22 is coupled to the controller 622_2 to receive the ready signal MSRX2_S2_READY. The third input terminal of the AND gate AND22 is coupled to the output terminal of the OR gate OR21. The output terminal of the AND gate AND22 is coupled to the interface circuit slice 621b to provide a ready signal RX_READY2. The first input terminal of the AND gate AND23 is coupled to the controller 622_2 to receive the ready signal MSRX2_S3_READY. The second input terminal of the AND gate AND23 receives the second reception ready signal UIRX2_READY from the application layer UIRX2. And the output terminal of the AND gate AND23 is coupled to the interface circuit slice 621c to provide a ready signal RX_READY3.

Figure 11:
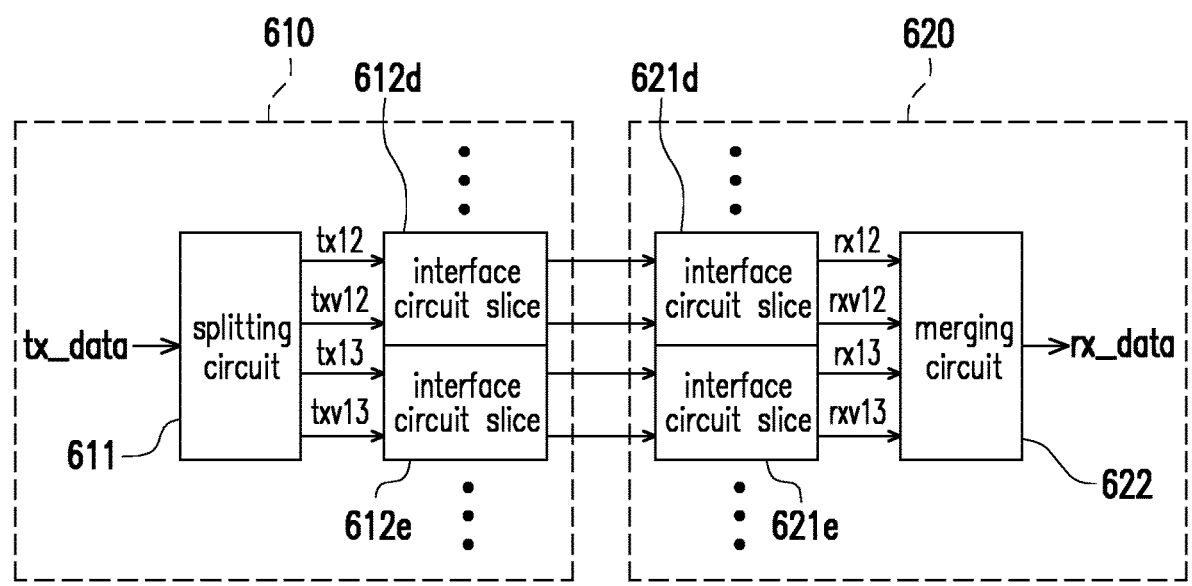
FIG. 11 is a schematic diagram of an operation scenario of the splitting circuit and the merging circuit shown in FIG. 6 according to another embodiment of the present disclosure.

FIG. 11 is a schematic diagram of an operation scenario of the splitting circuit 611 and the merging circuit 622 shown in FIG. 6 according to another embodiment of the present disclosure. Please refer to FIG. 6 and FIG. 11. The splitting circuit 611 may split the transmission data stream tx_data (the original data) into sub-data streams tx12 and tx13 to interface circuit slices 612d and 612e. Furthermore, the splitting circuit 611 also sends validity signals txv12 and txv13 to the interface circuit slices 612d and 612e. The validity signal txv12 indicates the validity of the sub-stream tx12, and the validity signal txv13 indicates the validity of the sub-stream tx13. The interface circuit slice 612d sends the sub-data stream tx12 and the validity signal txv12 to the interface circuit slice 621d, and the interface circuit slice 612e sends the sub-data stream tx13 and the validity signal txv13 to the interface circuit slice 621e, so that the interface circuit slice 621d may send the sub-data stream rx12 and the validity signal rxv12 to the merging circuit 622, and the interface circuit slice 621e may send the sub-data stream rx13 and the validity signal rxv13 to the merging circuit 622.

Table 2 is a timing example of the alignment operation of the sub-data streams rx12 and rx13 shown in FIG. 11. The vertical axis in Table 2 represents time. Please refer to FIG. 11 and Table 2. A timing example of the sub-data stream tx12 and the validity signal txv12 of the interface circuit slice 612d (or the sub-data stream tx13 and the validity signal txv13 of the interface circuit slice 612e) are as assumed in Table 2. In Table 2, "xxxx" means don't care, "d0" to "d11" indicate the data in different clock cycles, whereas "c0" to "c1" represent the control words in different clock cycles. In the column of validity signal txv12 (or txv13), "00" indicates invalid data, "01" and "10" indicate valid data, and "11" indicates the control words (non-data). The valid code "10" is used as an alignment mark. In the example shown in Table 2, a valid code "10" is inserted for every 5 valid data.

TABLE 2

Timing example of sub-data stream alignment

| 612d or 612e | | 621d | | 621e | | 622 | | | |
|---|---|---|---|---|---|---|---|---|---|
| tx12 or tx13 | txv12 or txv13 | rx12 | rxv12 | rx13 | rxv13 | rx12' | rxv12' | rx13' | rxv13' |
| xxxx | 00 | | | | | | | | |
| d0 | 10 | | | | | | | | |
| d1 | 01 | | | | | | | | |
| d2 | 01 | | | xxxx | 00 | | | | |
| d3 | 01 | | | d0 | 10 | | | | |
| c0 | 11 | xxxx | 00 | d1 | 01 | xxxx | 00 | xxxx | 00 |
| d4 | 01 | d0 | 10 | xxxx | 00 | d0 | 10 | d0 | 10 |
| xxxx | 00 | d1 | 01 | d2 | 01 | d1 | 01 | d1 | 01 |
| xxxx | 00 | d2 | 01 | d3 | 01 | d2 | 01 | d2 | 01 |
| d5 | 10 | d3 | 01 | c0 | 11 | d3 | 01 | d3 | 01 |
| d6 | 01 | c0 | 11 | d4 | 01 | c0 | 11 | c0 | 11 |
| xxxx | 00 | d4 | 01 | xxxx | 00 | d4 | 01 | d4 | 01 |
| d7 | 01 | xxxx | 00 | xxxx | 00 | xxxx | 00 | xxxx | 00 |
| c1 | 11 | d5 | 10 | d5 | 10 | d5 | 10 | d5 | 10 |
| d8 | 01 | d6 | 01 | d6 | 01 | d6 | 01 | d6 | 01 |
| d9 | 01 | xxxx | 00 | xxxx | 00 | xxxx | 00 | xxxx | 00 |
| d10 | 10 | d7 | 01 | d7 | 01 | d7 | 01 | d7 | 01 |
| d11 | 01 | c1 | 11 | c1 | 11 | c1 | 11 | c1 | 11 |
| | | d8 | 01 | d8 | 01 | d8 | 01 | d8 | 01 |
| | | d9 | 01 | xxxx | 00 | xxxx | 00 | xxxx | 00 |
| | | d10 | 10 | d9 | 01 | d9 | 01 | d9 | 01 |
| | | d11 | 01 | d10 | 10 | d10 | 10 | d10 | 10 |
| | | | | d11 | 01 | d11 | 01 | d11 | 01 |

The interface circuit slice 612d sends the sub-data stream tx12 and the validity signal txv12 to the interface circuit slice 621d, and the interface circuit slice 621d outputs the sub-data stream rx12 and the validity signal rxv12 to the merging circuit 622. Based on various factors, delay between the sub-data stream tx12 and the sub-data stream rx12 occurs, as shown in Table 2. Similarly, the interface circuit slice 612e sends the sub-data stream tx13 and the validity signal txv13 to the interface circuit slice 621e, and the interface circuit slice 621e outputs the sub-data stream rx13 and the validity signal rxv13 to the merging circuit 622. The delay of the sub-stream rx13 may be different from the delay of the sub-stream rx12, as shown in Table 2.

The merging circuit 622 may align the sub-data streams output by the interface circuit slices 621d and 621e by using the valid code "10" (the alignment mark). Table 2 shows the aligned sub-data streams rx12' and rx13' and the aligned validity signals rxv12' and rxv13'. The merging circuit 622 may merge the aligned sub-data streams rx12' and rx13' to generate a transmission data stream rx_data (the original data corresponding to the transmission data stream tx_data).

Based on different design requirements, the implementation of the splitting circuit 611 and/or the merging circuit 622 includes hardware, firmware, software (i.e., programs), or a combination of multiple ones of these three forms.

In terms of hardware, the splitting circuit 611 and/or the merging circuit 622 may be realized as a logic circuit on an integrated circuit. The related functions of the splitting circuit 611 and/or the merging circuit 622 may be implemented as hardware by using hardware description languages (such as, Verilog HDL or VHDL) or other suitable programming languages. For example, the related functions of the splitting circuit 611 and/or the merging circuit 622 may be realized as one or more controllers, microcontrollers, microprocessors, application-specific integrated circuits (ASIC), digital signal processor (DSP), field programmable gate array (FPGA), and/or all kinds of logic blocks, modules, and circuits in other processing units.

In terms of software and/or firmware, the related functions of the splitting circuit 611 and/or the merging circuit 622 may be realized with programming codes. For example, general programming languages (such as C, C++, or assembly language) or other suitable programming languages are adapted to implement the splitting circuit 611 and/or the merging circuit 622. The programming codes may be recorded/stored in a "non-transitory computer-readable medium." In some embodiments, the non-transitory computer-readable medium includes, for example, a read only memory (ROM), tape, disk, card, semiconductor memory, programming logic circuit, and/or storage device. The storage device includes a hard disk drive (HDD), a solid-state drive (SSD), or other storage devices. A central processing unit (CPU), a controller, a microcontroller, or a microprocessor can read and execute the programming codes from the non-transitory computer-readable medium to realize the related functions of the splitting circuit 611 and/or the merging circuit 622.

In summary, the splitting circuit 611 of the transmitter die 610 described in the foregoing embodiments may split the transmission data stream tx_data (the original data) into multiple first sub-data streams, then the multiple interface circuit slices 612 of the transmitter die 610 may send these sub-data streams to the interface circuit slices 621 of the integrated circuit die 620. The merging circuit 622 may selectively merge the sub-data streams from the interface circuit slices 621 back to the transmission data stream rx_data (the original data corresponding to the transmission data stream tx_data), and then provide the transmission data stream rx_data to the application layer. In an actual operating scenario, the sub-data streams output by different interface slices may have different delays. The merging circuit 622 may align the sub-data streams from the interface circuit slices 621 in timing, such that the integrated circuit die can mitigate different delays of the first interface circuit slices.

Although the present disclosure has been disclosed in the above embodiments, it is not intended to limit the present disclosure. Anyone with ordinary knowledge in the relevant technical field can make some changes and modifications without departing from the spirit and scope of the present disclosure. The scope of protection of the present disclosure shall be subject to those defined by the claims attached.

What is claimed is:

1. An integrated circuit die, comprising:
   a plurality of first interface circuit slices, wherein a first transmission data stream sent from a transmitter die is split into a plurality of first sub-data streams, and each of the first interface circuit slices provides a physical layer to receive a corresponding one of the first sub-data streams; and a merging circuit, coupled to the first interface circuit slices to receive the first sub-data streams, wherein the merging circuit merges the first sub-data streams from the first interface circuit slices back to an original data corresponding to the first transmission data stream to be provided to a first application layer, and the merging circuit aligns the first sub-data streams from the first interface circuit slices in timing to mitigate different delays of the first interface circuit slices.

2. The integrated circuit die according to claim 1, wherein a data width of any one of the first sub-data streams is the same as a bus width of a physical layer parallel bus of any one of the first interface circuit slices.

3. The integrated circuit die according to claim 1, wherein the merging circuit merges the first sub-data streams back to the original data according to an order of data arrival.

4. The integrated circuit die according to claim 1, wherein a second transmission data stream sent from the transmitter die is split into a plurality of second sub-data streams, one of the first sub-data streams is a first sub-stream, one of the second sub-data streams is a second sub-stream, the first sub-stream and the second sub-stream are sent to a same first interface circuit slice of the first interface circuit slices of the integrated circuit die through a same second interface circuit slice of the transmitter die, the same first interface circuit slice splits a data stream provided by the same second interface circuit slice back to the first sub-stream and the second sub-stream.

5. The integrated circuit die according to claim 4, wherein a sum of a data width of the first sub-stream and a data width of the second sub-stream is the same as a bus width of a physical layer parallel bus of the same first interface circuit slice.

6. The integrated circuit die according to claim 1, wherein the merging circuit comprises:

a controller, adapted to manage the first interface circuit slices to generate a plurality of ready signals, wherein each of the ready signals indicates whether a corresponding one of the first interface circuit slices is ready; and an AND gate, having a first input terminal coupled to the controller to receive one of the ready signals, a second input terminal adapted to receive a first reception ready signal from the first application layer, and an output terminal coupled to a corresponding one of the first interface circuit slices.

7. The integrated circuit die according to claim 1, wherein the merging circuit further comprises:

a first controller and a second controller, adapted to manage the first interface circuit slices to generate a plurality of ready signals, wherein each of the ready signals indicates whether a corresponding one of the first interface circuit slices is ready;

an OR gate, having a first input terminal coupled to the first application layer to receive a first reception ready signal, and a second input terminal adapted to receive a second reception ready signal from a second application layer; and an AND gate, having a first input terminal coupled to the first controller to receive one of the ready signals, a second input terminal coupled to the second controller to receive the other one of the ready signals, a third input terminal coupled to an output terminal of the OR gate, and an output terminal coupled to a corresponding one of the first interface circuit slices.

8. The integrated circuit die according to claim 1, wherein an identification number corresponding to the first transmission data stream is attached to each of a plurality of data words of the first transmission data stream, the merging circuit merges the first sub-data streams back to the original data by matching the identification number of the data words received from the first interface circuit slices.

9. The integrated circuit die according to claim 8, wherein, when any data word of the first sub-data streams from the first interface circuit slices is damaged, the merging circuit finds a first undamaged data word in the first sub-data streams from the first interface circuit slices by using the identification number, and aligns the first sub-data streams from the first interface circuit slices by using the identification number.

10. The integrated circuit die according to claim 1, wherein an alignment mark is attached to each of the first sub-data streams, and the merging circuit merges the first sub-data streams back to the original data according to the alignment mark.

11. The integrated circuit die according to claim 10, wherein each of the first interface circuit slices further receives frame information from the transmitter die, and the alignment mark is a designated code of a data valid indication field in the frame information.

12. The integrated circuit die according to claim 10, wherein, when any data word of the first sub-data streams from the first interface circuit slices is damaged, the merging circuit finds a first undamaged data word in the first sub-data streams from the first interface circuit slices by using the alignment mark, and aligns the first sub-data streams from the first interface circuit slices by using the alignment mark.

13. An operation method of an integrated circuit die, comprising:

providing a physical layer by each of a plurality of first interface circuit slices of the integrated circuit die to receive a corresponding one of a plurality of first sub-data streams, wherein a first transmission data stream sent from a transmitter die is split into the first sub-data streams;

aligning the first sub-data streams from the first interface circuit slices in timing by a merging circuit of the integrated circuit die to mitigate different delays of the first interface circuit slices; and merging, by the merging circuit, the first sub-data streams from the first interface circuit slices back to an original data corresponding to the first transmission data stream to be provided to a first application layer.

14. The operation method according to claim 13, wherein a data width of any one of the first sub-data streams is the same as a bus width of a physical layer parallel bus of any one of the first interface circuit slices.

15. The operation method according to claim 13, further comprising:

merging, by the merging circuit, the first sub-data streams back to the original data according to an order of data arrival.

16. The operation method according to claim 13, wherein a second transmission data stream sent from the transmitter die is split into a plurality of second sub-data streams, one of the first sub-data streams is a first sub-stream, one of the second sub-data streams is a second sub-stream, the first sub-stream and the second sub-stream are sent to a same first interface circuit slice of the first interface circuit slices of the integrated circuit die through a same second interface circuit slice of the transmitter die, and the operation method further comprises:
    splitting, by the same first interface circuit slice, a data stream provided by the same second interface circuit slice back to the first sub-stream and the second sub-stream.

17. The operation method according to claim 16, wherein a sum of a data width of the first sub-stream and a data width of the second sub-stream is the same as a bus width of a physical layer parallel bus of the same first interface circuit slice.

18. The operation method according to claim 13, wherein an identification number corresponding to the first transmission data stream is attached to each of a plurality of data words of the first transmission data stream, and the operation method further comprises:
    merging, by the merging circuit, the first sub-data streams back to the original data by matching the identification number of the data words received from the first interface circuit slices.

19. The operation method according to claim 18, further comprising:
    when any data word of the first sub-data streams from the first interface circuit slices is damaged, finding by the merging circuit a first undamaged data word in the first sub-data streams from the first interface circuit slices by using the identification number; and
    aligning, by the merging circuit, the first sub-data streams from the first interface circuit slices by using the identification number.

20. The operation method according to claim 13, wherein an alignment mark is attached to each of the first sub-data streams, and the operation method further comprises:
    merging, by the merging circuit, the first sub-data streams back to the original data according to the alignment mark.

21. The operation method according to claim 20, further comprising:
    receiving frame information from the transmitter die by each of the first interface circuit slices, wherein the alignment mark is a designated code of a data valid indication field in the frame information.

22. The operation method according to claim 20, further comprising:
    finding, by the merging circuit, a first undamaged data word in the first sub-data streams from the first interface circuit slices by using the alignment mark when any data word of the first sub-data streams from the first interface circuit slices is damaged; and
    aligning, by the merging circuit, the first sub-data streams from the first interface circuit slices by using the alignment mark.

23. An electronic system, comprising:
    a transmitter die, configured to split a first transmission data stream into a plurality of first sub-data streams; and
    an integrated circuit die, comprising:
        a plurality of first interface circuit slices, wherein each of the first interface circuit slices provides a physical layer to receive a corresponding one of the first sub-data streams; and
        a merging circuit, coupled to the first interface circuit slices to receive the first sub-data streams, wherein the merging circuit merges the first sub-data streams from the first interface circuit slices back to an original data corresponding to the first transmission data stream to be provided to a first application layer, and the merging circuit aligns the first sub-data streams from the first interface circuit slices in timing to mitigate different delays of the first interface circuit slices.

24. The electronic system according to claim 23, wherein the transmitter die comprises:
    a splitting circuit, splitting the first transmission data stream into the first sub-data streams; and
    a plurality of second interface circuit slices, coupled to the splitting circuit to receive the first sub-data streams, wherein the second interface circuit slices are used to transmit the first sub-data streams to the integrated circuit die.

25. The electronic system according to claim 23, wherein a data width of any one of the first sub-data streams is the same as a bus width of a physical layer parallel bus of any one of the first interface circuit slices.

26. The electronic system according to claim 23, wherein the merging circuit merges the first sub-data streams back to the original data according to an order of data arrival.

27. The electronic system according to claim 23, wherein a second transmission data stream sent from the transmitter die is split into a plurality of second sub-data streams, one of the first sub-data streams is a first sub-stream, one of the second sub-data streams is a second sub-stream, the first sub-stream and the second sub-stream are sent to a same first interface circuit slice of the first interface circuit slices of the integrated circuit die through a same second interface circuit slice of the transmitter die, the same first interface circuit slice splits a data stream provided by the same second interface circuit slice back to the first sub-stream and the second sub-stream.

28. The electronic system according to claim 27, wherein a sum of a data width of the first sub-stream and a data width of the second sub-stream is the same as a bus width of a physical layer parallel bus of the same first interface circuit slice.

29. The electronic system according to claim 23, wherein the merging circuit comprises:
    a controller, adapted to manage the first interface circuit slices to generate a plurality of ready signals, wherein each of the ready signals indicates whether a corresponding one of the first interface circuit slices is ready; and
    an AND gate, having a first input terminal coupled to the controller to receive one of the ready signals, a second input terminal adapted to receive a first reception ready signal from the first application layer, and an output terminal coupled to a corresponding one of the first interface circuit slices.

30. The electronic system according to claim 23, wherein the merging circuit further comprises:
    a first controller and a second controller, adapted to manage the first interface circuit slices to generate a plurality of ready signals, wherein each of the ready signals indicates whether a corresponding one of the first interface circuit slices is ready;
    an OR gate, having a first input terminal coupled to the first application layer to receive a first reception ready signal, a second input terminal adapted to receive a second reception ready signal from a second application layer; and
    an AND gate, having a first input terminal coupled to the first controller to receive one of the ready signals, a second input terminal coupled to the second controller to receive the other one of the ready signals, a third input terminal coupled to an output terminal of the OR gate, and an output terminal coupled to a corresponding one of the first interface circuit slices.

31. The electronic system according to claim 23, wherein an identification number corresponding to the first transmission data stream is attached to each of a plurality of data words of the first transmission data stream, the merging circuit merges the first sub-data streams back to the original data by matching the identification number of the data words received from the first interface circuit slices.

32. The electronic system according to claim 31, wherein, when any data word of the first sub-data streams from the first interface circuit slices is damaged, the merging circuit finds a first undamaged data word in the first sub-data streams from the first interface circuit slices by using the identification number, and aligns the first sub-data streams from the first interface circuit slices by using the identification number.

33. The electronic system according to claim 23, wherein an alignment mark is attached to each of the first sub-data streams, and the merging circuit merges the first sub-data streams back to the original data according to the alignment mark.

34. The electronic system according to claim 33, wherein each of the first interface circuit slices further receives frame information from the transmitter die, and the alignment mark is a designated code of a data valid indication field in the frame information.

35. The electronic system according to claim 33, wherein, when any data word of the first sub-data streams from the first interface circuit slices is damaged, the merging circuit finds a first undamaged data word in the first sub-data streams from the first interface circuit slices by using the alignment mark, and aligns the first sub-data streams from the first interface circuit slices by using the alignment mark.

* * * * *